United States Patent [19]

Brower et al.

[11] 4,169,281
[45] Sep. 25, 1979

[54] MULTILAMP PHOTOFLASH UNIT WITH ELECTROSTATIC PROTECTION

[75] Inventors: Boyd G. Brower; Donald W. Hartman, both of Williamsport, Pa.

[73] Assignee: GTE Sylvania Incorporated, Stamford, Conn.

[21] Appl. No.: 918,971

[22] Filed: Jun. 26, 1978

[51] Int. Cl.² .................................. G03B 15/02
[52] U.S. Cl. ................................ 362/13; 362/240; 362/241
[58] Field of Search ............... 362/11, 13, 240, 241

[56] References Cited

U.S. PATENT DOCUMENTS

| | | | |
|---|---|---|---|
| 3,941,992 | 3/1976 | Blount et al. | 362/13 |
| 4,113,424 | 9/1978 | Armstrong et al. | 362/13 X |

Primary Examiner—Stephen J. Lechert, Jr.
Attorney, Agent, or Firm—Edward J. Coleman

[57] ABSTRACT

A photoflash lamp array comprising a plurality of high-voltage type flashlamps mounted on a printed circuit board containing circuitry for sequentially igniting the flashlamps in response to successive high-voltage firing pulses applied thereto. The circuit board has an integral connector tab with a pair of terminals on one side connected to the igniting circuitry. Electrostatic protection is provided by a conductive shield of planar configuration disposed parallel to the circuit board and spaced therefrom on the side opposite that on which the lamps are disposed. The conductive shield is shaped with a portion thereof extending toward the end of the connector tab on the side opposite from the terminals to provide a discharge path for electrostatic charges in proximity to the tab. Preferably the shield extension is narrower than the tab and fits within a slotted recess therein between the tab and a back housing member.

15 Claims, 10 Drawing Figures

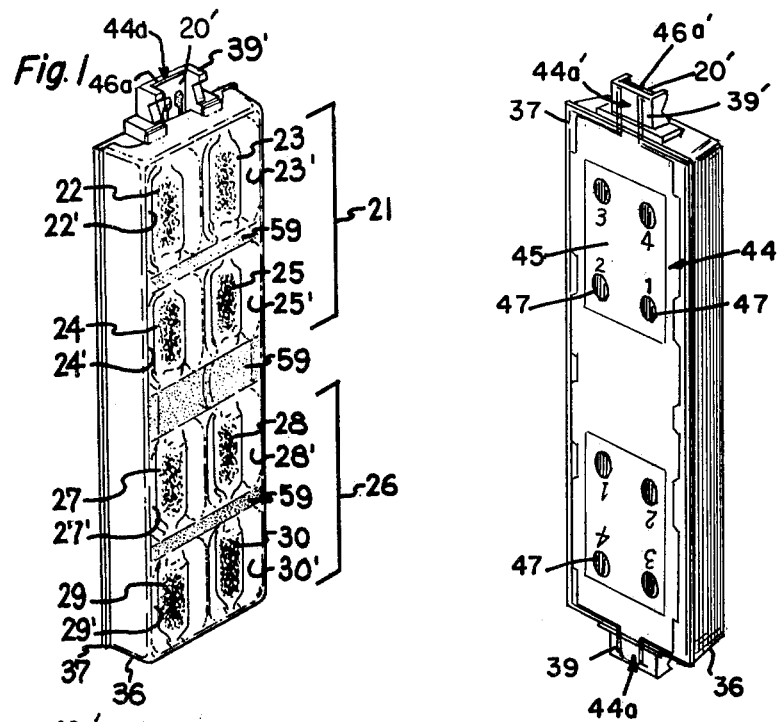
Fig. 1
Fig. 3
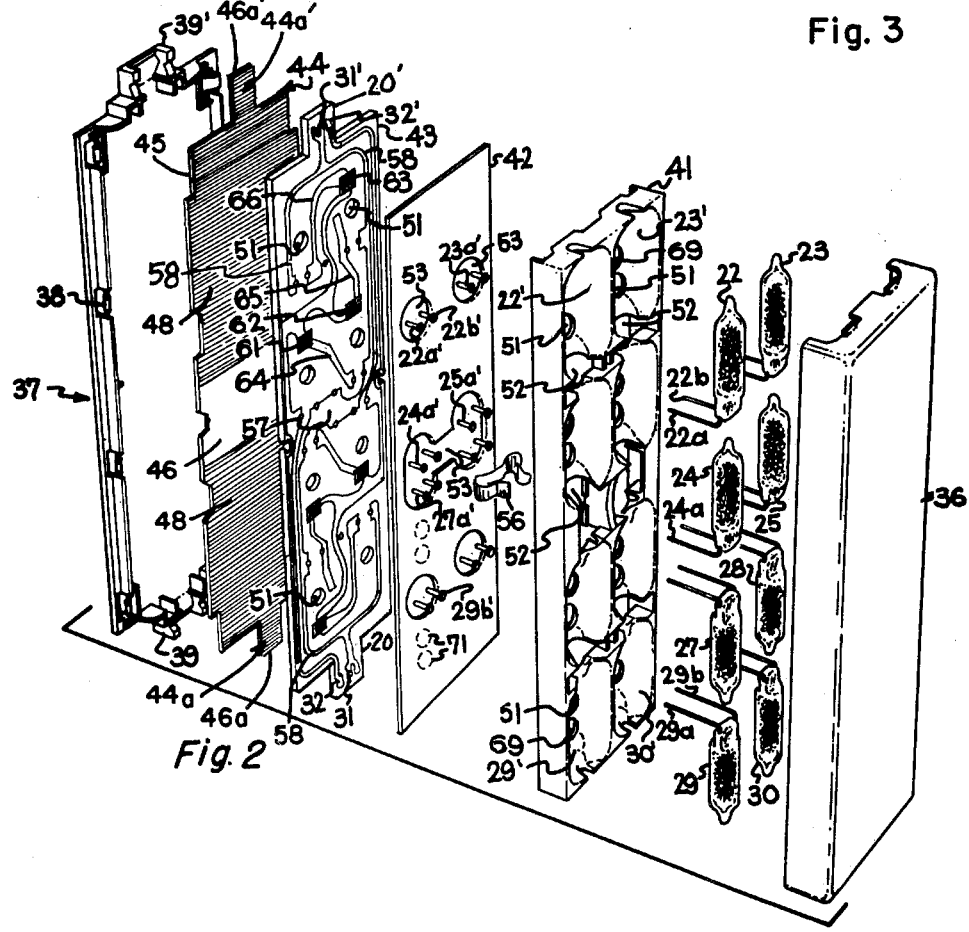
Fig. 2

MULTILAMP PHOTOFLASH UNIT WITH ELECTROSTATIC PROTECTION

BACKGROUND OF THE INVENTION

This invention relates to multilamp photoflash devices having circuit means for igniting the flashlamps and, more particularly, to high-voltage photoflash arrays with improved means for providing electrostatic protection.

Numerous multilamp photoflash arrangements with various types of sequencing circuits have been described in the prior art, particularly in the past few years. A currently marketed photoflash unit described in U.S. Pat. No. 3,894,226, and referred to as a flip flash, employs high-voltage type lamps adapted to be ignited sequentially by successively applied high-voltage firing pulses from a source such as a camera-shutter-actuated piezoelectric element. The flip flash unit comprises a planar array of eight high-voltage type flashlamps mounted on a printed circuit board with an array of respectively associated reflectors disposed therebetween. The lamps are arranged in two groups of four disposed on the upper and lower halves respectively of the rectangular-shaped circuit board. A set of terminal contacts at the lower end of the unit is provided for activation of the upper group of lamps, while a set of terminal contacts at the top of the unit is operatively associated with the lower group of four lamps. The application of successive high-voltage pulses (e.g. 500 to 4,000 volts from, say, a piezoelectric source controlled by the shutter of a camera in which the array is inserted) to the terminal contacts at the lower end of the unit causes the four lamps at the upper half of the array to be sequentially ignited. The array may then be turned end for end and again inserted into the camera in order to flash the remaining four lamps.

The flip flash circuit board comprises an insulating sheet of plastic having a pattern of conductive circuit traces, including the termainal contacts, on one side. The flashlamp leads are electrically connected to these circuit traces by means of eyelets secured to the circuit board and crimped to the lead wires. The circuitry on the board includes six printed, normally opened, connect switches that chemically change from a high to low resistance, so as to become electrically conducting after exposure to the radiant heat energy from an ignited flashlamp operatively associated therewith. The purpose of these switches is to promote lamp sequencing and one-at-a-time flashing. The four lamps of each group are arranged in parallel with three of the four lamps being connected in series with their respective thermal connect switches. Initially, only the first of the group of four lamps is connected directly to the voltage pulse source. When this first lamp flashes, it causes its associated thermal connect switch (which is series connected with the next, or second lamp) to become permanently conductive. Because of this action, the second lamp of the group of four is connected to the pulse source. This sequence of events is repeated until all four lamps have been flashed.

The primers used in the high-voltage type flashlamps employed in such arrays are designed to be highly sensitive toward high-voltage breakdown. Electrical energies as low as a few microjoules are sufficient to promote ignition of such primers and flashing of the lamps. This high sensitivity is needed in order to provide lamps that will function reliably from the compact and inexpensive piezoelectric sources that are practical for incorporation into modern miniature cameras. The mechanical energy delivered to the piezoelectric crystal, and thereby the electrical output energy therefrom, is limited both by the size of the device and by the necessity to minimize camera vibration and motion during use.

The high degree of electrical sensitivity needed in high-voltage flashlamps gives rise to distinct problems of inadvertent flashing during handling of the array package. Any static charges on equipment and personnel can cause the lamps to flash. This problem is discussed in the aforementioned U.S. Pat. No. 3,894,226, and one means described therein for protecting against inadvertent flashing is to make the reflector member electrically conductive, such as fabricating it of metal-coated plastic and electrically connecting the reflector to an electrical "ground" portion of the circuitry on the circuit board. Thus, the reflector member functions as an electrical shield and increases the stray capacitance to ground of the electrical "ground" of the circuitry, reducing the possibility of accidental flashing of lamps by electrostatic voltage on a person or object touching the array.

A further approach that has been used in marketed flip flash arrays for providing electrostatic protection is to metalize the back surface of the circuit board, such as by hot stamping, and connect that metalized surface to the common circuit conductor run, for example, by means of an eyelet through the board, thereby providing a planar conductive shield behind the lamps and most of the circuitry. This back of the board shielding technique is described in U.S. Pat. No. 3,941,992.

Improvements over the hot stamping method for providing a shield at the back of the array housing are described in copending application Ser. No. 644,674, filed Dec. 29, 1975 and assigned to the present assignee, and in U.S. Pat. Nos. 4,019,043 and 4,036,578. In brief, these improvements relate to a planar conductive shield member which is parallel to and spaced from the back surface of the circuit board and connected to the common circuit conductor. In specific embodiments described, the shield comprises a generally rectangular sheet of metal foil laminated between a paper indicia sheet, which faces the back of the array housing, and a sheet of heat-shrinkable plastic, which faces the circuit board. The heat-shrinkable plastic provides electrical insulation and also functions to provide flash indicators, as viewed through openings in the indicia sheet and shield aligned with respective lamps. In some embodiments, electrical connection between the common circuit conductor run on the circuit board and the metal foil insert shield is provided by differential bending of the eyelets retaining the lamp leads. The advantages of using a spaced-apart conductive insert shield, instead of a metallic stamping on the back of the circuit board, include a reduction of the capacitive coupling between the shield and firing circuitry and the provision of shielding between the eyelets and the back of the array. These factors have in turn led to a reduction in the incidence of accidental flashing of lamps by electrostatic voltage changes in proximity to the array.

The present invention provides a significant improvement over these prior art shielding techniques by further reducing, a very substantial extent, the percentage of failures due to accidental electrostatic flashing.

SUMMARY OF THE INVENTION

Accordingly, it is an object of this invention to provide a photoflash array having an improved means for significantly reducing inadvertent electrostatic flashing of high voltage lamps contained therein.

A further object is to provide such an improved array in a manner that is feasible and economical to manufacture and does not alter the interchangeability of the array with existing camera sockets.

These and other objects, advantages and features are attained, in accordance with the principles of this invention, by employing a spaced-apart conductive planar shield at the back of the array which is shaped and arranged to provide a portion thereof which extends toward the free end of the connector tab of the printed circuit board. This shield extension is disposed on the side of the tab opposite that on which the terminals are located in order to provide a discharge path to the shield for electrostatic charges in proximity to the connector tab. Preferably, the shield extension is narrower than the connector tab and fits within a slotted recess provided on the side of the tab opposite from the terminals. More specifically, the array has a back housing member which includes an integral extension partly surrounding the connector tab and exposing the terminals thereon. The tab and back housing extension together comprise a plug-in connector for the array. Accordingly, by locating the shield extension within a slotted recess in the tab, the thickness or the plug-in connector sandwich comprising the tab and back housing extension is not altered by the presence of the shield extension, and interchangeability of the plug-in connector with existing camera sockets is not affected. Further, the slotted recess renders the extended portion of the shield more readily accessible for discharge thereto of electrostatic charges in proximity to the connector tab. Additional enhancement of the overall shielding effect is attained by providing printed circuit terminals on the connector tab that are spaced at least one-sixteenth of an inch from the free end of the tab, thereby providing a spatial arrangement on the connector which causes proximate electrostatic discharges to be biased away from the terminals and toward the shield extension.

BRIEF DESCRIPTION OF THE DRAWINGS

This invention will be more fully described hereinafter in conjunction with the accompanying drawings in which:

FIG. 1 is a perspective view of a multilamp photoflash array;

FIG. 2 is an exploded view of the lamp array of FIG. 1 showing the internal parts including the planar shield of this invention;

FIG. 3 is a perspective view of the back of the array of FIG. 1 showing shield and insert extensions according to the invention;

DESCRIPTION OF PREFERRED EMBODIMENT

Figure 7:
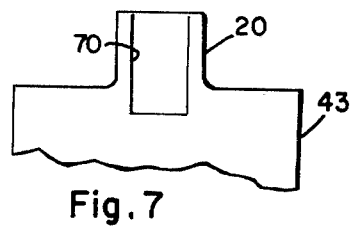
FIG. 7 is a fragmentary back view of a portion of the circuit board used in FIG. 1 showing a slotted recess in the tab thereof.

The concepts of the present invention are particularly useful as embodied in a multilamp photoflash array similar to the type described in U.S. Pat. No. 3,894,226 and referred to as a flip flash. As illustrated in FIGS. 1 and 2, this multilamp unit is of the planar array type which contains a plurality of electrically fired flashlamps and is provided with a printed circuit connector tab 20 at the lower side or end thereof, adapted to fit into a socket of a camera or flash adaptor. The array is provided with a second printed circuit connector tab 20' at the top side or end thereof, whereby the array unit is adapted to be attached to the camera socket in either of two orientations, i.e., with either the tab 20 or tab 20' plugged into the socket. The array is provided with an upper group 21 of flashlamps 22, 23, 24 and 25, and a lower group 26 of flashlamps 27, 28, 29 and 30, the lamps being arranged in a planar configuration. Reflectors 22', etc., are disposed behind their respective flashlamps so that as each lamp is flashed, its light is projected forwardly of the array. The lamps are arranged and connected so that when the array is connected to a camera by the connector 20, only the upper group 21 of lamps will be flashed, and when the array is turned end for end and connected to the camera by the other connector 20', only the then upper group 26 of lamps will be flashed. By this arrangement, only lamps relatively far from the camera lens axis are flashable, thus reducing the undesirable redeye effect.

The construction of the array comprises front and back housing members 36 and 37 which preferably are made of plastic and are provided with interlocking members 38 which can be molded integrally with the housing members and which lock the housing members together in final assembly to form a unitary flash array structure. In the preferred embodiment shown, the front housing member 36 is a rectangular concavity and the back housing member 37 is substantially flat and includes integral extensions 39 and 39' at the ends thereof which partly surround and protect the printed circuit connect tabs 20 and 20' and also function to facilitate mechanical attachment to the camera socket. Sandwiched between the front and back housing members 36 and 37, in the order named, are the flashlamps 22, etc., an electrically conductive unitary reflector member 41 (preferably of aluminum-coated plastic) shaped to provide the individual reflectors 22', etc., an electrically insulating sheet 42, a printed circuit board 43 provided with integral connector tabs 20 and 20', and a multipurpose insert sheet 44 which may be provided on one side with information and trademarks, and other indicia such as flash indicators 47 (also see FIG. 3) located behind the respective lamps and which change color due to heat and/or light radiation from a flashing lamp, thus indicating at a glance which of the lamps have been flashed and not flashed.

Figure 4:
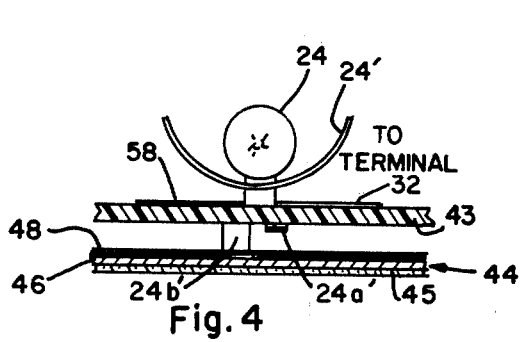
FIG. 4 is a sectional schematic showing the alignment of an individual lamp of the array of FIGS. 1 and 2 with respect to the remainder of the assembly, and particularly illustrating a preferred means for contacting and spacing the rear planar shield.

Referring to FIGS. 2–4, the insert sheet 44 comprises a sheet of paper 45 or thin cardboard on which the above-mentioned indicia is provided, a metal shield 46 in the form of a lamination or coating of metal, such as aluminum, on the surface of the paper sheet opposite that on which the indicia is provided, and a flash indicator coating or laminate sheet 48 of plastic over the shield 46. Openings 51 are provided through the reflector unit 41 and the circuit board 43 to facilitate radiation from flashing lamps reaching the flash indicator sheet 48, which shrinks or melts or changes color behind a flashed lamp in response to radiation from the lamp when flashed, thus indicating that the lamp has been flashed. For example, biaxially oriented polypropylene comprises a particularly suitable material for sheet 48. The flash indicators 47 are provided by openings through paper sheet 45 and metal shield layer 46, in alignment with the openings 51 through the circuit board and reflector unit, and the rear housing member 37 is transparent (either of clear material or provided with window openings) to permit viewing of the flash indicators and other indicia on the indicia sheet 45 from the rear of the array. The flash indicator sheet 48 can comprise two or more individual sheets covering the openings 47. The front housing member 36 is transparent, at least on front of the lamps 22, etc., to permit light from flashing lamps to emerge forwardly of the array, and may be tinted to alter the color of the light from the flashlamps.

The height and width of the rectangular array are substantially greater than its thickness, and the height and width of the reflector member 41, insulating sheet 42 and circuit board 43 are substantially the same as the interior height and width of the housing member 36 to facilitate holding the parts in place.

The tab 20, which is integral with the circuit board 43, is provided with a pair of electrical terminals 31 and 32 (see FIG. 5 also), and similarly the tab 20' is provided with a pair of terminals 31' and 32' for contacting terminals of a camera socket for applying firing voltage pulses to the array. The terminals 31 and 31' are shown as having an "h" shape to reduce the likelihood of the lamps being accidentally flashed by electrostatic voltage when the array is handled.

The circuit board 43 has a printed circuit thereon, as will be described, for causing sequential flashing of the lamps by firing voltage pulses applied to the terminals 31, 32, or 31', 32'. The top and bottom halves of the printed circuitry preferably are reversed mirror images of each other. The lead-in wires 22a, 22b, etc., of the lamps 22, etc. may be attached to the circuit board 43 in various ways such as by means of metal eyelets 22a', 22b', etc. secured in respective lead-through holes in the circuit board. The lead-in wires 22a, 22b etc. pass through openings 52 in the reflector member 41 and through openings 53 in the insulating sheet 42 and into or through the respective pairs of eyelets 22a', 22b', etc. and the ends of the eyelets are crimped to hold the lead wires and make electrical contact thereto. The heads of the eyelets are rolled over in electrical contact with the circuit of the circuit board. A metal clip 56 is clipped onto the reflector member 41, which reflector is preferably made of metal-coated plastic, and the rear of the clip 56 rests in touching contact against an area 57 of an electrical ground circuit comprising a continuous conductor-run 58 on the board and which includes, or is connected to, the terminals 31 and 31' and which is connected in common and makes contact with one of each of the pairs of connector eyelets for each of the lamps 22 etc., whereby the reflector unit 41 additionally functions as an electrically grounded shield. More specifically, in the upper half of the circuit board, the common circuit conductor 58 is connected electrically with a respective contact area of the eyelets 22a, 23b', 24b', and 25b'.

Whereas the reflector unit 41 provides a shield at the front of the array, as described above, the aforementioned metal shield layer 46 of the insert sheet 44 provides a conductive shield of planar configuration at the back of the array. This planar shield 46 is disposed substantially parallel to the plane of the circuit board and, as will be described, is spaced therefrom on the side opposite the surface containing the above-described printed circuitry and is electrically connected to the common circuit conductor run.

In the illustrated embodiment (FIGS. 2 and 4), electrical contact between the planar shield 46 and common circuit conductor 58 is achieved by way of the common-connected lead-in wires of the lamps and associated eyelets which extend, or project, through the rear of the circuit board. Further, the projection of these eyelets at an angle from the rear of the circuit board serves to maintain a spacing between the conductive corona shield layer 46 and the circuit board. In order to prevent short circuiting of the lamps, the "hot" eyelet and lead-in wire of each lamp (i.e., those connected via switching circuitry to terminal 32 or 32') are bent over toward the rear surface of the circuit board to prevent contact between such eyelets or lead-in wires and the planar shield (see U.S. Pat. No. 4,036,578 and the aforementioned copending application Ser. No. 644,674). For example, as illustrated in FIG. 4, the projecting portion of eyelet 24b' (which is connected via its associated printed circuit contact area to the common conductor run 58) is in contact with the planar shield 46 and thereby provides both electrical connection and a physical spacing between the shield and circuit board, while the "hot" eyelet 24a' is bent up tightly in contact with the rear surface of the circuit board.

In the overall configuration of the array eyelets, all the "hot" eyelets (namely, 22b', 23a', 24a', 25a', 27b', 28b', 29b' and 30a') are pressed tightly against the board. A uniform spacing between the board and shield, along with electrical connection to the common conductor, can be provided by the projecting common-connected eyelets 22a', 23b', 24b', 25b', 27a', 28a', 29a', and 30b'. Of course, if desired, only selected ones of the common-connected eyelets need be in contact with the shields 46, e.g., 24b', 25b', 27a' and 28a'. This arrangement is provided in FIG. 2, wherein the metal shield layer 46 is exposed at the midportion of insert sheet 44 between two separate sheets 48 of flash indicator material.

Areas 59 on the transparent front housing member 36 may be made opaque or partly opaque, such as by making the surface roughened at these areas, to fully or partially conceal the lamp lead-in wires 22a, 22b, etc., and/or the lower portions of the lamps, for improved appearance of the array.

The circuit board terminal 32 is part of a conductor run that is electrically connected to lead-in wires 24a of lamp 24 at the eyelet 24a' and terminates at radiation switches 61, 62 and 63 respectively positioned near lamps 24, 25 and 23. A circuit board conductor run 64 is connected electrically to the remaining lead-in wire of flashlamp 25 at eyelet 25a' and terminates at the radiation switch 61. A circuit board conductor run 65 is connected to the remaining lead-in wire of flashlamps 23 at eyelet 23a' and terminates at the radiation switch 62. Similarly, a circuit board conductor run 66 is connected to the remaining lead-in wire of flashlamp 22 at eyelet 22b' and terminates at radiation switch 63.

The radiation switches 61, 62 and 63 respectively are in contact with and bridge across the circuit runs that are connected to them. The material for the radiation switches may be suitable material initially having an open circuit or high resistance, the resistance thereof becoming zero or of a low value when the material receives radiation in the form of heat and/or light from a respective adjacent lamp upon the lamp being flashed. For this purpose, each of the radiation switches is respectively positioned behind and near to a flashlamp 24, 25 and 23. Windows in the form of transparent sections or openings 69 may be provided in the reflectors in front of the switches as shown in FIG. 2 to facilitate radiation transfer. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

Small openings 71, indicated with dashed lines in FIG. 2, can be provided through the transparent insulating sheet 42 in alignment with the openings 51 and 69 in the reflector unit 41 to improve radiation transfer, if desired.

As has been explained, the lower portion of the circuit board contains a substantially reverse mirror image of the same circuit shown on the upper part of the circuit board and, therefore, will not be described in detail. It will be noted that the circuit runs from the plugged-in terminals 31 and 32 at the lower part of the circuit board, extend upwardly so as to activate the circuitry in the upper half of the circuit board. Similarly, when the unit is turned around and tab 20' is plugged into a socket, the circuit board terminals 31' and 32' will be connected to and activate the lamps which then will be in the upper half of the circuit board, and hence in the upper half of the flash unit. This accomplishes, as has been stated, the desirable characteristic whereby only the group of lamps relatively farthest away from the camera lens axis will be flashed, thereby reducing or eliminating the undesirable red-eye effect.

The circuit on the circuit board 43 of FIG. 2 functions as follows. Assuming that none of the four lamps in the upper half of the unit have been flashed, upon occurrence of a first firing pulse applied across the terminals 31, 32, this pulse will be directly applied to the lead-in wires of the first connected flashlamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25 via the now-closed radiation switch 61 whereupon the second lamp 25 flashes, thereby causing radiation switch 62 to assume zero or low resistance, and the second lamp 25 now has an open circuit or high resistance between its lead-in wires. When the next firing pulse occurs, it is applied via now-closed radiation switch 62 to the third lamp 23, thereby firing the lamp which becomes an open circuit, and the radiation from it causes the radiation switch 63 to become essentially a closed circuit across its terminals. Thus, the next firing pulse will be applied via now-closed radiation switch 63 to the lead-in wires of the fourth flashlamp 22, thereupon causing the lamp to flash. Since this lamp is the last lamp in the active circuit, it does not matter whether its lead-in wires are an open or closed circuit after flashing. Additional flashlamps, radiation switches and electrical conductors can be employed, if desired, using the just-described principles. When the flash unit is turned around and the other connector tab 20' attached to the camera socket, the group of lamps that then become uppermost and relatively farthest away from the lens axis will be in an active circuit and will be flashed in the same manner as has been described. In a preferred embodiment, the lamps 22 etc., are high-voltage types requiring 2,000 volts, for example, at low current for flashing, and they can be fired by impacting or stressing a piezoelectric element in the camera.

Figure 5:
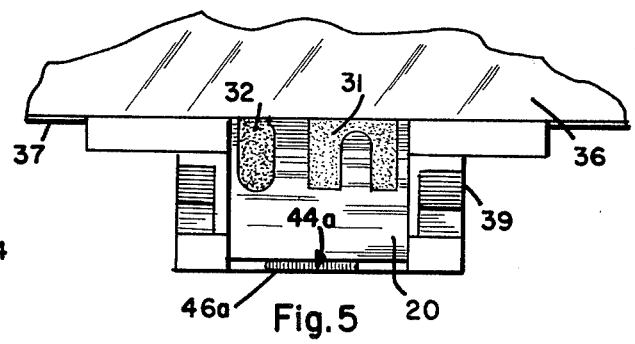
FIG. 5 is an enlarged fragmentary elevation of the connector tab portion of the array of FIG. 1.

In accordance with the present invention, the planar conductive shield 46 is shaped and arranged with a portion 46a thereof extending toward the free end of the connector tab 20 on the side of tab 20 opposite that on which terminals 31 and 32 are located. In like manner, a portion 46a' at the other end of shield 46 is extended toward the free end of tab 20' at the opposite end of the array. For ease in manufacturing the laminated insert sheets 44, each of these shield extensions 46a and 46a' may have the plastic flash indicator material 48 laminated on the side facing the circuit board and the paper indicia sheet 45 laminated on the side facing the back housing member 37. Accordingly, the laminated extensions of the insert sheet 44 behind tabs 20 and 20' are denoted as 44a and 44a', respectively. In the description that follows, the discussion will be limited, for convenience, to shield extension 46a and tab 20; however, it is to be understood that it applies in like manner to extension 46a' and tab 20'. As best illustrated in FIG. 5, tab 20 preferably is slightly shorter than the back housing member extension 39, and shield extension 46a (insert extension 44a) preferably extends beyond the free end of the connector tab 20 in the order of a few thousandths of an inch (e.g. about 0.005 inch). This affords a direct ground path from the exterior of the array (at the free end of the tab 20) to the electrostatic shield 46 at the back of the array. As a result, extension 46a has been found to provide an improved discharge path to shield 46 for electrostatic charges in proximity to tab 20 whereby the likelihood of accidental flashing of lamps by such electrostatic charges is significantly reduced.

Connector assembly variations wherein the free end of tab 20 substantially coincides with the free end of back housing extension 39 and or wherein shield extension 46a is flush with the end of tab 20 or slightly shorter than tab 20 have proved satisfactory.

The previously mentioned hot stamp shield of U.S. Pat. No. 3,941,992 shows an extension of the metal shield pattern onto the circuit board tab. It is limited to the length of the circuit board and, typically, does not extend that far, but it is equal to the length of the common circuit. This makes any arcing to the array tab equally likely to arc to the common runs as to the shielding, and any use of the common run as a discharge path increases the likelihood of accidental electrostatic flashes.

According to the present invention, in order to bias discharges away from the terminals 31 and 32 toward the shield extension 46a, the shield extension 46a is made narrower than the connector tab 20, as shown, and/or the terminals 31 and 32 are spaced at least one-sixteenth of an inch from the free end of the connector tab, as best shown in FIG. 5. Hence, shield portion 46a extends beyond the terminals toward the free end of the tab.

Figure 6:
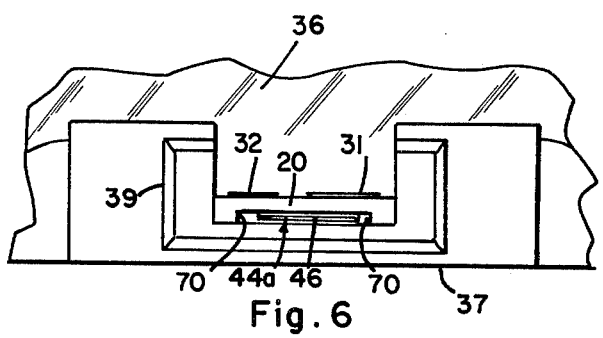
FIG. 6 is an end view of the connector tab of FIG. 5 showing the location of the shield and insert extension in a slotted recess of the connector tab in accordance with the invention.
Figure 9:
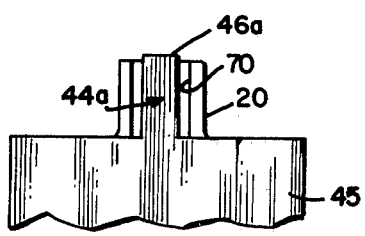
FIG. 9 is a fragmentary back view similar to FIG. 7 but showing the insert sheet and shield, with extension thereof, superimposed in position over the back of the circuit board.

As illustrated, the shield extension 46a, and thus, the insert extension 44a, is disposed between the connector tab 20 and the extension 39 of the back housing member. As previously mentioned, tab 20 and back extension 39 together comprise a plug-in connector for the array. In some applications, a direct sandwich of material 44a between the surfaces of tab 20 and extension 39 may prove satisfactory. Where camera socket tolerances are critical, however, the thickness of the sandwich comprised of tab 20 and extension 39 may be significantly altered by tolerance variations in the insert extension 44a (or shield extension 46a), particularly if the extension is as wide as the tab. This can adversely affect interchangeability with the camera sockets. Accordingly, as a further aspect of the present invention, the side of connector tab 20 opposite that on which terminals 31 and 32 are located contains a slotted recess 70 narrower than the width of the tab (see FIGS. 6-9). Further, the extending portion 46a of the shield (and 44a of the insert) is narrower than the connector tab (FIGS. 6 and 9) and fits within the slotted recess 70. As a result, the circuit board tab surfaces on each side of slot 70 firmly abut with the mating surfaces of back housing extension 39, as best shown in FIG. 6, to provide a fixed dimensional control on connector thickness. In this manner, the thickness of the sandwich comprised of tab 20 and extension 39 is not altered by the presence of the shield extension 46a (and insert extension 44a) therebetween. Such a design permits comparatively wide tolerances on the thickness of the laminated insert 44. In addition, whereas the hot stamp shield extension of U.S. Pat. No. 3,941,992 can actually be sealed shut from the free end of the connector, the slotted recess 70 of the present invention renders the shield extension 46a accessible for discharge thereto of electrostatic charges in proximity to tab 20.

Figure 10:
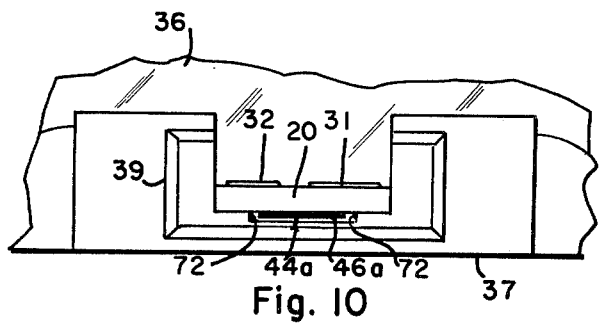
FIG. 10 is an end view of the connector tab showing an alternative embodiment in which the shield and insert extension is located in a slotted recess of the back housing extension.
Figure 8:
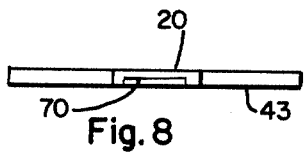
FIG. 8 is an end view of FIG. 7.

In an alternative to providing a slotted recess 70 in tab 20, the same results can be obtained by providing a slotted recess 72 in the side of the back housing member extension 39 which faces the side of tab 20 opposite that on which 31 and 32 are located, as illustrated in FIG. 10. The slotted recess 72 is narrower than the width of tab 20, and the extending portion 46a of the shield (and 44a of the insert) is narrower than tab 20 and fits within the slotted recess 72 in the back housing member extension.

According to a specific embodiment of the invention, tab 20 has a width of about 0.389 inch and a length of about 0.348 inch; circuit board 43, exclusive of tabs 20, has a mean length of 4,768 inches; slotted recess 70 has a width of about 0.269 inch and a length of about 0.485 inch; shield extension 46a (insert extension 44a) has a width of about 0.185-0.193 inch and a length of 0.338-0.343 inch; the shield-insert (46, 44) exclusive of the extensions (46a, 44a), has a mean length of 4.770±0.005 inches. The thickness of the tab 20 (and circuit board 43) is about 0.043 inch, and the depth of the slotted recess is about 0.014 inch.

The advantage of this invention is that it reliably provides a very significant improvement in electrostatic protection for high-voltage type multilamp units in a way that is inexpensive and which lends itself readily to automated lamp manufacturing processes.

Although the invention has been described with respect to a specific embodiment, it will be appreciated that modifications and changes may be made by those skilled in the art without departing from the true spirit and scope of the invention. For example, the insert sheet 44 may comprise only two layers, namely, the paper indicia sheet 45 and the metal shield layer 46; i.e., the flash indicator function may be provided by means other than a sheet 48. Further, the paper indicia sheet 45 may also be eliminated, thereby leaving only the planar metal shield 46 with its extensions 46a and 46a' at the back of the array.

What we claim is:

1. A photoflash lamp array comprising a circuit board having circuitry disposed thereon, a plurality of flashlamps positioned over one side of said circuit board and each having a pair of lead-in wires connected to said circuitry, said circuitry being provided for igniting said flashlamps, said circuitry including a group of pairs of flashlamp contact areas and a common circuit conductor connected electrically with one contact area of each of said pair thereof, each pair of said flashlamp lead-in wires being electrically connected to a respective pair of said contact areas, said circuit board having a connector tab with first and second terminals on the side of said tab coinciding with said one side of the circuit board, said tab having a free end spaced from the remainder of the circuit board, said common circuit conductor being connected to the first terminal of said tab, means disposed on said circuit board for connecting the second terminal of said tab to the other contact area of each of said pairs thereof, an electrically conductive shield of planar configuration positioned substantially parallel to the plane of said circuit board and spaced from at least part of the side thereof opposite said one side, and means electrically connecting said planar shield to said common circuit conductor, said planar shield being shaped and arranged with a portion thereof extending toward the free end of said connector tab on the side of the opposite that on which said terminals are located in order to provide a discharge path to said shield for electrostatic charges in proximity to said connector tab and reduce the likelihood of accidental flashing of lamps by said charges.

2. The array of claim 1 wherein said extending portion of said planar shield extends beyond the free end of said connector tab in the order of a few thousandths of an inch.

3. The array of claim 1 wherein said extending portion of said planar shield is narrower than said connector tab.

4. The array of claim 1 wherein said first and second terminals are spaced at least one-sixteenth of an inch from the free end of said connector tab.

5. The array of claim 1 further including a housing with front and back members enclosing said lamps, circuit board and shield, and wherein said connector tab is integral with circuit board, said back member of the housing is substantially flat and includes an integral extension which party surrounds said connector tab exposing said terminals thereon, and said planar shield is located between said circuit board and said back member of the housing, with said extending portion of the shield disposed between said connector tab and said extension of the back housing member.

6. The array of claim 5 wherein said integral extension of the back housing member has a free end spaced from the remainder of the housing and substantially coinciding with the free end of said extending portion of the connector tab.

7. The array of claim 6 wherein said connector tab and said integral extension of the back housing member together comprise a plug-in connector for said array, the side of said connector tab opposite that on which said terminals are located contains a slotted recess narrower than the width of said tab, and said extending portion of said planar shield is narrower than said connector tab and fits within said slotted recess, whereby the thickness of the sandwich comprised of said tab and said extension of the back housing member is not altered by the presence of the extending portion of the shield therebetween.

8. The array of claim 7 wherein said extending portion of said planar shield extends beyond the free end of said connector tab in the order of a few thousandths of an inch.

9. The array of claim 8 wherein said extending portion of said planar shield extends beyond the free end of said integral extension of the back housing member in the order of a few thousandths of an inch.

10. The array of claim 5 wherein the side of said connector tab opposite that on which said terminals are located contains a slotted recess narrower than the width of said tab, and said extending portion of said planar shield is narrower than said connector tab and fits within said slotted recess, whereby said slotted recess renders said extending portion of said shield accessible for discharge thereto of electrostatic charges in proximity to said connector tab.

11. The array of claim 10 wherein said planar conductive shield is provided with flash indicator openings respectively aligned with said flashlamps, and a sheet of heat sensitive plastic material is laminated to the side of said planar shield facing said circuit board in a manner covering said openings.

12. The array of claim 11 wherein said back member of the housing is transparent, a sheet of paper is laminated to the side of said planar shield facing said back housing member, said sheet of paper has openings aligned with the openings in said planar shield, and indicia is provided on the surface of said paper sheet facing said back housing member.

13. The array of claim 10 wherein said planar conductive shield is provided with flash indicator openings respectively aligned with said flashlamps, said back member of the housing is transparent, a sheet of paper is laminated to the side of said planar shield facing said back housing member, said sheet of paper has openings aligned with the openings in said planar shield and indicia is provided on the surface of said paper sheet facing said back housing member.

14. The array of claim 10 wherein said first and second terminals are spaced at least one-sixteenth of an inch from the free end of said connector tab.

15. The array of claim 5 wherein the side of said extension of the back housing member facing the side of said connector tab opposite that on which said terminals are located contains a slotted recess narrower than the width of said tab, and said extending portion of said planar shield is narrower than said connector tab and fits within said slotted recess in the back housing member extension.

* * * * *